United States Patent
Wu

(10) Patent No.: US 10,620,551 B2
(45) Date of Patent: Apr. 14, 2020

(54) LITHOGRAPHY SYSTEM AND LITHOGRAPHY METHOD

(71) Applicant: SEMICONDUCTOR MANUFACTURING INTERNATIONAL (SHANGHAI) CORPORATION, Shanghai (CN)

(72) Inventor: Qiang Wu, Shanghai (CN)

(73) Assignee: SEMICONDUCTOR MANUFACTURING INTERNATIONAL (SHANGHAI) CORPORATION (CN)

(*) Notice: Subject to any disclaimer, the term of this patent is extended or adjusted under 35 U.S.C. 154(b) by 0 days.

(21) Appl. No.: 16/216,362

(22) Filed: Dec. 11, 2018

(65) Prior Publication Data

US 2019/0121242 A1    Apr. 25, 2019

Related U.S. Application Data

(63) Continuation of application No. 13/924,325, filed on Jun. 21, 2013, now Pat. No. 10,180,631.

(30) Foreign Application Priority Data

Dec. 13, 2012  (CN) .......................... 2012 1 0537189

(51) Int. Cl.
*G03F 7/20* (2006.01)

(52) U.S. Cl.
CPC ...... *G03F 7/70716* (2013.01); *G03F 7/70358* (2013.01); *G03F 7/70725* (2013.01); *G03F 7/70758* (2013.01)

(58) Field of Classification Search
CPC ............ G03F 7/70758; G03F 7/70716; G03F 7/70358; G03F 7/70725; G03F 7/709
See application file for complete search history.

(56) References Cited

U.S. PATENT DOCUMENTS

| | | | |
|---|---|---|---|
| 6,157,159 A | 12/2000 | Korenaga et al. | |
| 6,177,978 B1* | 1/2001 | Korenaga | G03F 7/70358 355/53 |
| 6,392,825 B1 | 5/2002 | Trunz et al. | |
| 6,903,468 B2* | 6/2005 | Korenaga | G03B 27/48 310/12.19 |
| 7,932,646 B2* | 4/2011 | Shibata | G03B 27/58 310/12.05 |
| 2004/0057817 A1 | 3/2004 | Hazelton | |
| 2006/0290916 A1* | 12/2006 | Yamamoto | G03F 7/70516 355/77 |
| 2008/0158539 A1 | 7/2008 | Shibata | |

FOREIGN PATENT DOCUMENTS

| | | |
|---|---|---|
| CN | 101303533 A | 11/2008 |
| CN | 202257029 U | 5/2012 |
| JP | 50178630 A | 9/1985 |
| JP | 2002022868 A | 1/2002 |
| JP | 3720593 | 9/2005 |

* cited by examiner

*Primary Examiner* — Steven Whitesell Gordon
(74) *Attorney, Agent, or Firm* — Innovation Counsel LLP

(57) ABSTRACT

A lithography system may include a wafer stage. The wafer stage may include a wafer mounting part configured to carry a wafer and configured to oscillate along a plane that is parallel to a top surface of the wafer in a wafer exposure process. The wafer stage may further include a driving device configured to affect an oscillatory movement of the wafer mounting part in the wafer exposure process.

15 Claims, 5 Drawing Sheets

```
┌─────────────────────────────┐
│ making a mask and a wafer undergo │
│ an oscillatory movement, and the │
│ oscillatory movement of the mask │──── 601
│ and the oscillatory movement of the │
│ wafer are synchronized with each │
│ other │
└─────────────────────────────┘
              │
              │
┌─────────────────────────────┐
│ regulating the intensity of an │
│ illuminating beam according to the │──── 602
│ speeds of the wafer and the mask │
└─────────────────────────────┘
              │
              │
┌─────────────────────────────┐
│ irradiating the mask and at least a │
│ portion of the wafer with the │
│ regulated illuminating beam, thereby │──── 603
│ obtaining a desirable photo-resist │
│ pattern on the wafer surface │
└─────────────────────────────┘
```

Fig. 6

LITHOGRAPHY SYSTEM AND LITHOGRAPHY METHOD

CROSS-REFERENCE TO RELATED APPLICATION(S)

This application is a continuation application of U.S. application Ser. No. 13/924,325 (filed Jun. 21, 2013), which claims priority to and benefit of Chinese Patent Application No. 201210537189.9 (filed on Dec. 13, 2012); the prior applications are incorporated herein by reference.

FIELD OF THE INVENTION

The present invention is related to a lithography system and a lithography method for processing one or more wafers.

DESCRIPTION OF THE RELATED ART

Lithography may be one of the most important steps in a modern semiconductor manufacturing process. During processing of a wafer, various physical components, such as transistors, diodes, capacitors, resistors, and metal connectors, may be formed through a lithography process, which may involve use of masks, formation of films, removal of certain portions, and retention of portions with featured patterns on the wafer. An object of the lithography process is to produce featured patterns having accurate sizes that are in accordance with the requirements of circuit design.

Presently, step-and-scan printing technologies have been used in lithography processes. In a typical photolithography machine for performing step-and-scan printing, a reduction lens is used for scanning an image with a large exposure field onto a portion of a silicon chip. Generally, a narrow and focused light strip is simultaneously swept overamask and a wafer (e.g. a silicon chip) such that a portion of the wafer is exposed through the mask pattern at a reduction ratio, e.g., 4:1 or 5:1, in each process step. The process steps continue until the entire wafer is exposed.

During the scanning process performed by the step-and-scan photolithography machine, the mask and the wafer are each scanned with a constant speed at a fixed reduction ratio. During the scanning process, a wafer stage and a mask stage firstly are accelerated to their respective speeds from a static state. For example, the wafer stage is accelerated from the static state to 700 mm/s, while the mask stage is accelerated from the static state to 2800 mm/s (in the case where the image reduction ratio is 4:1). When the wafer stage and the mask stage are at respective constant speeds, an illuminating beam sweeps the wafer and the mask for processing a portion of the wafer. After the portion of the wafer has been sufficiently processed, the wafer stage and the mask stage are decelerated to the static state and moved to a next position for processing the next portion of the wafer. The scanning process step that includes acceleration, constant speed, and deceleration of the wafer stage and the mask stage may be repeated for processing different portions of the wafer. The acceleration and the deceleration of the wafer stage and the mask stage may require a substantial amount of time. The acceleration and the deceleration of the stages may also consume a substantial amount of energy. The drive motor that accelerates and decelerates the stages may produce an undesirably great amount of heat.

SUMMARY OF THE INVENTION

One or more embodiments of the invention may be related to a wafer stage that may be used in a lithography system and/or may be used in lithography process. The wafer stage may include a wafer mounting part configured to carry a wafer and configured to oscillate along a plane that is parallel to a top surface of the wafer in a wafer exposure process. The wafer stage may further include a driving device (e.g., a motor) configured to affect an oscillatory movement of the wafer mounting part in the wafer exposure process.

In one or more embodiments, the oscillatory movement is substantially a simple harmonic oscillation.

In one or more embodiments, the wafer stage may include a side member spaced from the wafer mounting part. The side member may remain stationary in the wafer exposure process. The wafer stage may further include an elastic beam mechanically connected between the wafer mounting part and the side member.

In one or more embodiments, a cross section of the elastic beam is perpendicular to the plane and has a rectangular shape that includes a first side and a second side shorter than the first side. The first side is perpendicular to the plane; the second side is parallel to the plane.

In one or more embodiments, the elastic beam has a curved portion that enables the elastic beam to elongate along a longitudinal direction of the elastic beam.

In one or more embodiments, an elastic coefficient of the curved portion in an oscillation direction of the wafer mounting part is larger than an elastic coefficient of the entire elastic beam in the oscillation direction of the wafer mounting part.

In one or more embodiments, the curved portion has at least one of a "U" shape, a "V" shape, and an arc shape.

In one or more embodiments, the driving device includes one or more electromagnetic motors disposed under the wafer mounting part or disposed at a (bottom) portion of the wafer mounting part.

In one or more embodiments, the wafer stage may include a monitoring device configured to monitor at least one of a position and a speed of the wafer mounting part. The wafer stage may further include a control device configured to control the one or more electromagnetic motors according to the at least one of the position and the speed of the wafer mounting part.

In one or more embodiments, the monitoring device includes a position measuring device disposed under at least one of the wafer mounting part, the elastic beam, and the side member.

In one or more embodiments, the position measuring device includes at least one of an interferometer and an encoder-reader system.

In one or more embodiments, the wafer stage may include a first buffering device and a second buffering device arranged in an oscillation direction of the wafer mounting part. The wafer stage may further include a third buffering device and a fourth buffering device arranged in a direction substantially perpendicular to the oscillation direction of the wafer mounting part. A portion of the wafer mounting part is disposed between the first buffering device and the second buffering device. The portion of the wafer mounting part is disposed between the third buffering device and the fourth buffering device. A distance between the first buffering device and the portion of the wafer mounting part is greater than a distance between the third buffering device and the portion of the wafer mounting part.

In one or more embodiments, the wafer stage may include a levitating device configured to levitate the wafer mounting part in the air (e.g., above a platform of a lithography system).

In one or more embodiments, the levitating device includes at least one of a magnetic levitation device and an air cushion levitation device.

One or more embodiments of the invention may be related to a lithography system that includes the wafer stage.

One or more embodiments of the invention may be related to using the wafer stage in a lithography process.

One or more embodiments of the invention may be related to lithography system that may include a mask mounting part configured to carry a mask and configured to oscillate along a plane that is parallel to a top surface of the mask in a wafer exposure process. The lithography system may further include a first driving device configured to affect an oscillatory movement of the mask mounting part in the wafer exposure process.

In one or more embodiments, the lithography system may further include a light source configured to emit an illuminating beam in the wafer exposure process. The lithography system may further include a wafer mounting part configured to carry a wafer and configured to oscillate along a plane that is parallel to a top surface of the wafer in the wafer exposure process. The lithography system may further include a second driving device configured to affect an oscillatory movement of the wafer mounting part in the wafer exposure process. The lithography system may further include a control device configured to synchronize the oscillatory movement of the mask mounting part with the oscillatory movement of the wafer mounting part. The lithography system may further include an illumination regulating device configured to regulate the intensity of the illuminating beam according to at least one of a speed of the wafer mounting part and a speed of the mask mounting part for irradiating a regulated illuminating beam through the mask onto at least a portion of the wafer in the wafer exposure process.

In one or more embodiments, the mask mounting part is configured to move in a first direction when the wafer mounting part moves in a second direction opposite the first direction in the wafer exposure process.

In one or more embodiments, an oscillation frequency of the mask mounting part is equal to an oscillation frequency of the wafer mounting part in the wafer exposure process, and an oscillation amplitude of the mask mounting part is greater than an oscillation amplitude of the wafer mounting part and is a multiple of the oscillation amplitude of the wafer mounting part in the wafer exposure process.

One or more embodiments of the invention may be related to a lithography method that may include oscillating a mask along a plane that is parallel to a top surface of the mask. The lithography method may further include oscillating a wafer along a plane that is parallel to a top surface of the wafer. The lithography method may further include regulating intensity of an illuminating beam according to at least one of a speed of the mask and a speed of the wafer for providing a regulated illuminating beam. The lithography method may further include irradiating the regulated illuminating beam through the mask onto at least a portion of the wafer.

In one or more embodiments, an oscillation frequency of the mask is equal to an oscillation frequency of the wafer, and an oscillation amplitude of the mask is greater than an oscillation amplitude of the wafer and is a multiple of the oscillation amplitude of the wafer.

One or more embodiments of the present invention may be related to a wafer stage that may include a wafer mounting part configured to support a wafer. The wafer stage may further include a driving device configured to drive the wafer mounting part in an oscillatory movement of the wafer mounting part along and/or within a plane parallel to a wafer surface of the wafer.

In one or more embodiments, the oscillatory movement is substantially a simple harmonic oscillation.

In one or more embodiments, the wafer stage further comprises at least one elastic beam through which the wafer mounting part is elastically connected to a fixed part of the wafer stage, wherein the direction of the oscillatory movement of the wafer mounting part is perpendicular to at least one of an insertion portion of the elastic beam that is inserted in the fixed part and a connection direction in which the elastic beam is connected to the fixed part. The direction of the oscillatory movement of the wafer stage is parallel to a side of the fixed part that receives the elastic beam.

In one or more embodiments, a cross section of the elastic beam is parallel to the direction of the oscillatory movement of the wafer mounting part and is in the shape of a rectangle, wherein the rectangle includes long sides and short sides, wherein the long sides are perpendicular to the wafer surface, and wherein the short sides are parallel to the wafer surface.

In one or more embodiments, the elastic beam has a curved portion that enables the elastic beam to elongate along a longitudinal direction of the elastic beam.

In one or more embodiments, an elastic coefficient of the curved portion in the oscillation direction of the wafer mounting part is larger than that of the entire elastic beam in the oscillation direction of the wafer mounting part.

In one or more embodiments, the curved portion is in the shape of a "U", a "V", and/or an arc.

In one or more embodiments, the driving device includes one or more electromagnetic motors disposed under the wafer mounting part.

In one or more embodiments, the wafer stage may include a monitoring device configured to monitor a position and/or a speed of the wafer mounting part. The wafer stage may further include a control device configured to control the one or more electromagnetic motors according to the position (and/or the speed) of the wafer mounting part so as to compensate for position deviation of the wafer mounting part.

In one or more embodiments, the monitoring device includes a position measuring device disposed under the wafer mounting part.

In one or more embodiments, the position measuring device includes an interferometer and/or an encoder-reader system.

In one or more embodiments, the wafer stage may include a stepping buffering device configured to drive the wafer stage during a stepping process of the wafer stage.

In one or more embodiments, the wafer stage may include a levitating device configured to levitate the wafer mounting part in the air.

In one or more embodiments, the levitating device includes a magnetic levitation device and/or an air cushion levitation device.

One or more embodiments of the present invention may be related to a mask stage that may include a mask mounting part configured to mount a mask. The mask stage may further include a driving device configured to drive the mask mounting part such that in an oscillatory movement of the mask mounting part along and/or within a plane parallel to a mask surface of the mask.

In one or more embodiments, the oscillatory movement is substantially a simple harmonic oscillation.

In one or more embodiments, the mask stage further comprises at least one elastic beam through which the mask mounting part is elastically connected to a fixed part of the mask stage, wherein the direction of the oscillatory movement of the mask mounting part is perpendicular to at least one of an insertion portion of the elastic beam that is inserted in the fixed part and a connection direction in which the elastic beam is connected to the fixed part. The direction of the oscillatory movement of the wafer stage is parallel to a side of the fixed part that receives the elastic beam.

In one or more embodiments, a cross section of the elastic beam is parallel to the direction of the oscillatory movement of the mask mounting part and is in the shape of a rectangle, wherein the rectangle includes long sides and short sides, wherein the long sides are perpendicular to the wafer surface, and wherein the short sides are parallel to the wafer surface.

In one or more embodiments, the elastic beam has a curved portion that enables the elastic beam to elongate along a longitudinal direction of the elastic beam.

In one or more embodiments, an elastic coefficient of the curved portion in the oscillation direction of the mask mounting part is larger than that of the entire elastic beam in the oscillation direction of the wafer mounting part.

In one or more embodiments, the curved portion is in the shape of a "U", a "V", and/or an arc.

In one or more embodiments, the driving device includes one or more electromagnetic motors disposed under the mask mounting part.

In one or more embodiments, the wafer stage may include a monitoring device configured to monitor a position and/or a speed of the mask mounting part. The mask stage may further include a control device configured to control the one or more electromagnetic motors according to the position (and/or the speed) of the mask mounting part so as to compensate for position deviation of the mask mounting part.

In one or more embodiments, the monitoring device includes a position measuring device disposed under the mask mounting part.

In one or more embodiments, the position measuring device includes an interferometer and/or an encoder-reader system.

In one or more embodiments, the mask stage may include a stepping buffering device configured to drive the mask stage during a stepping process of the mask stage.

In one or more embodiments, the mask stage may include a levitating device configured to levitate the mask mounting part in the air.

In one or more embodiments, the levitating device includes a magnetic levitation device and/or an air cushion levitation device.

One or more embodiments of the present invention may be related to a lithography system that may include a light source configured to emit an illuminating beam to be regulated and then irradiated through a mask onto at least a portion of a wafer. The lithography system may further include a wafer mounting part configured to carry a wafer. The lithography system may further include a first driving device configured to drive the wafer mounting part in an oscillatory movement of the wafer mounting part along and/or within a plane parallel to wafer surface. The lithography system may further include a mask mounting part configured to carry a mask. The lithography system may further include a second driving device configured to drive the mask mounting part in an oscillatory movement of the mask mounting part within a plane parallel to mask surface. The lithography system may further include a control device configured to synchronize the oscillatory movement of the mask mounting part and the oscillatory movement of the wafer mounting part. The lithography system may further include an illumination regulating device configured to regulate the intensity of the illuminating beam according to the speed of the wafer mounting part and/or the speed of the mask mounting part.

One or more embodiments of the present invention may be related a lithography method that may include the following steps: making a mask undergo an oscillatory movement along and/or within a plane parallel to a mask surface of the mask; making a wafer (which is coated with a photo sensitive layer or a photoresist) undergo an oscillatory movement along and/or within a plane parallel to a wafer surface of the wafer), wherein the wafer surface and the mask surface are parallel to each other, and the oscillatory movement of the mask and the oscillatory movement of the wafer are synchronized with each other in opposite directions; regulating the intensity of an illuminating beam according to the speed of the wafer and/or the speed of the mask; and irradiating the mask and at least a portion of the wafer with the regulated illuminating beam, thereby forming a (desirable) photoresist pattern on the wafer surface.

Embodiments of the present invention may advantageously minimize power consumption and/or heat generation in a wafer exposure process, utilizing the wafer and mask oscillatory movements.

Further features and advantages of the present invention will become apparent from the following detailed description with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

The present invention can be better understood by reading the following detailed description with reference to the accompanying drawings.

FIG. 6 is a flowchart illustrating a lithography method according to one or more embodiments of the present invention.

DETAILED DESCRIPTION OF THE EMBODIMENTS

Figure 1A:
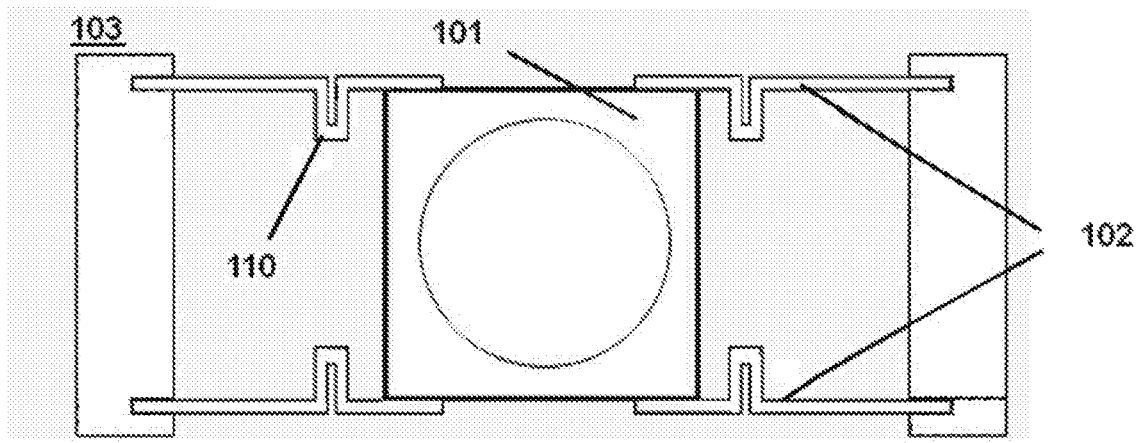
FIGS. 1A, 1B, 1C are schematic views illustrating parts of a wafer stage according to one or more embodiments of the present invention.

Embodiments of the present invention will now be described in detail with reference to the drawings. It should be noted that the relative arrangement of the components and steps, the numerical expressions, and numerical values set forth in these example embodiments are illustrative, but not limiting, unless specifically stated otherwise.

For the convenience of description, each component in the figures may not have been necessarily drawn to scale.

Techniques, methods, and apparatuses known to one of ordinary skill in the relevant art may not be discussed in detail but are intended to be part of the specification where appropriate.

Similar reference numerals and letters may refer to similar items in the=figures. Once an item has been defined with reference to one figure, it may not need to be further discussed for other figures.

Figure 1B:
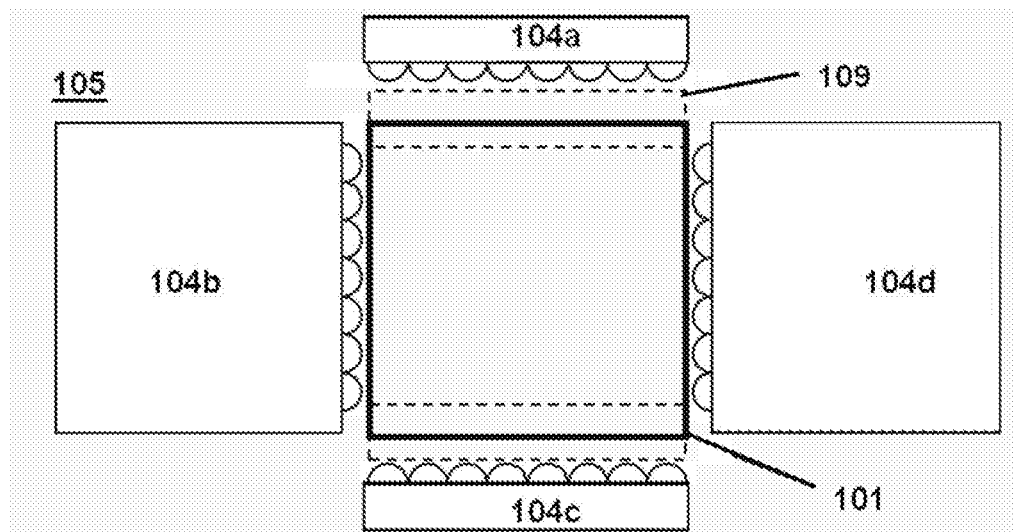
Figure 1C:
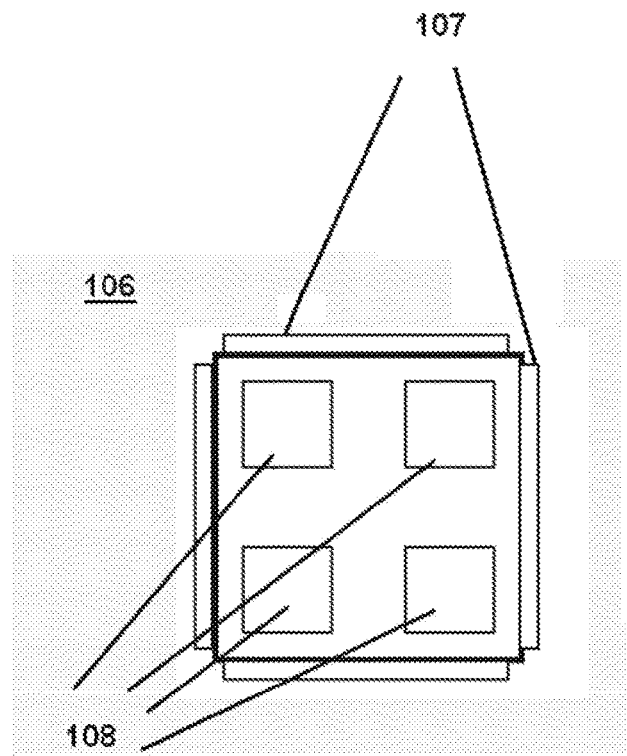

FIGS. 1A to 1C are schematic views illustrating parts of a wafer stage according to one or more embodiments of the present invention.

The wafer stage may have a three-layer structure that includes an upper layer 103, a middle layer 105, and a lower layer 106.

FIG. 1A shows a top view illustrating the upper layer 103 of the wafer stage. As illustrated in FIG. 1A, the upper layer 103 of the wafer stage may include a first portion (e.g., an upper portion) of a wafer mounting part 101 for supporting one or more wafers and elastic beams 102 that elastically connect the wafer mounting part 101 to at least two stationary side members (or brackets) of the wafer stage. Being connected to the elastic beams 102, the wafer mounting part 101 can substantially oscillate along and/or within a plane in which the wafer lies (i.e. a plane substantially parallel to a wafer surface). For example, with the elastic beams 102 illustrated in FIG. 1A, the wafer mounting part 101 can go through an oscillation (such as substantially a simple harmonic oscillation) in directions parallel to the elongation direction of the side members (which secure ends of the elastic beams 102) within a principal plane. In one or more embodiments, factors such as elasticity of the elastic beams 102 and the mass of the wafer mounting part 101 may be configured such that the frequency of the simple harmonic oscillation may be in a range from about 1 Hz to a theoretic limit (e.g. 200 Hz) of current suitable measuring mechanism.

In one or more embodiments, as illustrated in FIG. 1A, the wafer stage may include the elastic beams 102 to support the wafer mounting part 101 and to implement oscillatory movement of the wafer mounting part 101. In one or more embodiments, the elastic beams 102 can be replaced with one or more other mechanisms for providing oscillatory movement of the wafer mounting part 101 and for supporting the wafer mounting part 101.

In one or more embodiments, as illustrated in FIG. 1A, four elastic beams 102 are adopted for supporting and oscillating the wafer mounting part 101. In one or more embodiments, the number of the elastic beams can be different from four. In one or more embodiments, five or more elastic beams can be used in the wafer stage for supporting and/or oscillating the wafer mounting part 101. In one or more embodiments, three or fewer elastic beams can be used in the wafer stage for supporting and/or oscillating the wafer mounting part 101. In one or more embodiments, a single elastic beam can be adopted in the wafer stage for supporting and oscillating the wafer mounting part 101.

In one or more embodiments, each elastic beam 102 has a shape of a flat plate with bend, e.g., a U-shaped or V-shaped bend near the attachment end of the elastic beam 102 that is attached to the wafer mounting part 101. A cross section of each elastic beam 102 in a plane that is perpendicular to a top surface of the wafer mounting part 101 may be a rectangle that has long sides and short sides. The long sides of the rectangle are along a direction perpendicular to the wafer surface, and the short sides of the rectangle are along a direction parallel to the wafer surface. The flatness of the elastic beam 102 can be defined by the ratio of the long side and the short side, wherein the larger the ratio, the flatter the elastic beam. With such flat elastic beams, the wafer mounting part 101 can undergo an oscillatory movement along and/or within a plane parallel to the wafer surface, and the wafer mounting part can be prevented from undergoing an oscillatory movement in other directions (e.g. a direction perpendicular to the wafer surface).

Furthermore, as illustrated in FIG. 1A, the elastic beam 102 has a curved portion 110 (or bend 110) of a "U" shape. The curved portion 110 will allow the elastic beam 102 to elongate along a longitudinal direction when the amplitude of the oscillatory movement of the wafer mounting part 101 is large, such that the wafer mounting part 101 can undergo an oscillatory movement of large amplitude. One of ordinary skill in the art should understand that, the curved portion 110 of a "U" shape is illustrative, and the curved portion 110 can be of other shapes such as "V" shape or an arc shape. In one or more embodiments, the elastic coefficient of the curved portion 110 in the oscillation direction(s) of the wafer mounting part is larger than the elastic coefficient of the entire elastic beam 102 in the oscillation direction (s) of the wafer mounting part. For example, the curved portion 110 can be made to have a relatively small length in circumference (in view of the total length of the elastic beam 102). The curved portion 110 made in such way will increase the energy required to rotate the wafer mounting part along an axis perpendicular to the wafer surface, such that rotation of the wafer state around this vertical axis may be prevented or minimized during the oscillatory movement, for realizing stable scanning.

In one or more embodiments, each of the elastic beams 102 may include a composite structure. For example, each elastic beam 102 may include multiple layers of materials. Such a composite structure can provide rigidity in directions other than the scanning direction and can provide desirable repeatability.

In one or more embodiments, as illustrated in FIG. 1A, the wafer mounting part 101 has a square shape for facilitating alignment with the wafer and for facilitating connection with the elastic beams. In one or more embodiments, the wafer mounting part 101 may have one or more other shapes. In one or more embodiments, the wafer mounting part 101 can be rectangular shape for providing sufficient tolerance of wafer placement. In one or more embodiments, the wafer mounting part 101 may have a round shape that is similar to the wafer shape.

FIG. 1B illustrates a structure of the middle layer 105 of the wafer stage according to one or more embodiments of the present invention. The middle layer 105 of the wafer stage may include a second portion (e.g., a middle or lower portion) of the wafer mounting part 101 (which is connected to the first portion of the wafer mounting part 101 illustrated in FIG. 1A) and stepping buffering devices 104a, 104b, 104c, and 104d. As illustrated by the dotted blocks 109 in FIG. 1B, the second portion of the wafer mounting part 101 may undergo an oscillatory movement between the stepping buffering 104a and 104c in directions parallel to opposite (and overlapping) sides of the stepping devices 104b and 104d under the action of the elastic beams 102 illustrated in FIG. 1A. Around the second portion of the wafer mounting part 101, the stepping buffering devices 104a to 104d are arranged. The stepping buffering devices 104a and 104c are arranged in the movement directions (or oscillation directions) of the second portion of the wafer mounting part 101, i.e. the second portion of the wafer mounting part 101 may move toward the stepping buffering device 104a and the stepping buffering device 104c alternately during oscillation. The stepping buffering devices 104a and 104c may keep a relatively wide gap from the wafer mounting part 101, such that the wafer mounting part 101 will not collide with the stepping buffering devices 104a or 104c during normal oscillation movement. The stepping buffering devices 104b and 104d are arranged in a direction perpendicular to the direction of the oscillatory movement of the wafer mounting part 101 with the second portion of the wafer mounting part 101 being configured to oscillated between a side of the stepping buffering device 104b and a side of the stepping buffering device 104d in directions substantially parallel to the side of the stepping buffering device 104b and the side of the stepping buffering device 104d.

In one or more embodiments, as illustrated in FIG. 1B, the stepping buffering devices 104a to 104d have flexible portions at their edges for cushioning. The purpose of stepping is to move the wafer stage to a next exposure shot for scanning a next wafer portion after the scanning (of a wafer portion) of one exposure shot has finished. The stepping may initiate the oscillation of the wafer mounting part 101. The stepping buffering devices 104a to 104d may convey (or drive) the wafer mounting part 101 during the stepping of the wafer stage, and the flexible portions can prevent the wafer mounting part 101 from colliding with other components during rapid stepping. Advantageously, interference or disturbance caused by stepping on the oscillatory movement of the wafer mounting part 101 may be minimized, the speed of stepping may be maximized, and the time required for the wafer mounting part 101 to restore the oscillatory movement after stepping through a position measuring device (e.g. an interferometer described in detail later) and a compensating device may be minimized. In one or more embodiments, the flexible portions of the stepping buffering devices may prevent the elastic beams 102 from damage due to excessively large oscillation amplitude of the wafer mounting part 101.

FIG. 1C illustrates a structure of the lower layer 106 of the wafer stage according to one or more embodiments of the present invention.

As illustrated in FIG. 1C, the lower layer 106 includes a motorized member (which may be a third portion of the wafer mounting part 101), an electromagnetic motors 108, and interferometer mirrors 107. The four electromagnetic motors 108 are arranged on the motorized member in the lower layer 106, while the interferometer mirrors 107 are arranged around the motorized member in the lower layer 106. In one or more embodiments, if the oscillatory movement of the wafer mounting part 101 is sustained only by the action of the elastic beams 102, the oscillatory movement of the wafer mounting part 101 will be a damped oscillation, wherein the oscillation amplitude of the wafer mounting part 101 may decrease gradually and may eventually decrease to zero. In order to make the oscillatory movement of the wafer mounting part 101 maintain a substantially constant amplitude, in one or more embodiments, the electromagnetic motors 108 will compensate for the oscillatory movement of the wafer mounting part 101. In one or more embodiments, the control device of the lithography system compares the current position of the wafer mounting part 101 measured by the interferometer with a desirable position of the wafer mounting part 101 (i.e. a position of the wafer mounting part 101 if it undergoes an free or frictionless oscillation without any damping), calculates a compensation amount according to the comparison result, and then instructs the electromagnetic motors 108 to drive the wafer mounting part 101 in accordance with the calculated compensation amount. Accordingly, the wafer mounting part 101 may oscillate with a substantially constant oscillation amplitude during lithography process. In one or more embodiments, the above comparing process and calculating process can be performed by a separate control device that is disposed in the wafer stage.

In one or more embodiments, the interferometer mirrors 107 are a component of the interferometer. The interferometer is an example of a monitoring device for monitoring the current position and/or speed of the wafer mounting part 101. In one or more embodiments, the position-speed monitoring device can comprise one or more other position measuring devices, such as an encoder-reader system. The electromagnetic motors 108 are an example of a compensating device for compensating for position deviation and/or oscillation amplitude deviation of the wafer mounting part 101 in accordance with the position and/or speed of the wafer mounting part 101.

During the stepping process of the wafer stage, one or more of the stepping buffering devices 104a to 104d may collide with or rub with the wafer mounting part 101. As a result, material of the flexible portions may fall off in the form of particles. If the particles fall on the interferometer mirrors 107, errors or even failures may appear in the measurements of the interferometer. In one or more embodiments, the lower layer 106 may include a movable baffle (not shown) for blocking the particles. During the stepping process, the baffle may move to a position above the lower layer 106 so as to protect the interferometer mirrors 107 from being polluted by the falling particles. When the stepping is finished and when scanning is ready to be performed, the baffle is removed so as to expose the underlying interferometer mirrors 107. Therefore, the interferometer mirrors 107 may be effectively protected, for ensuring correct measurement of the position and/or speed of the wafer mounting part 101.

Figure 2:
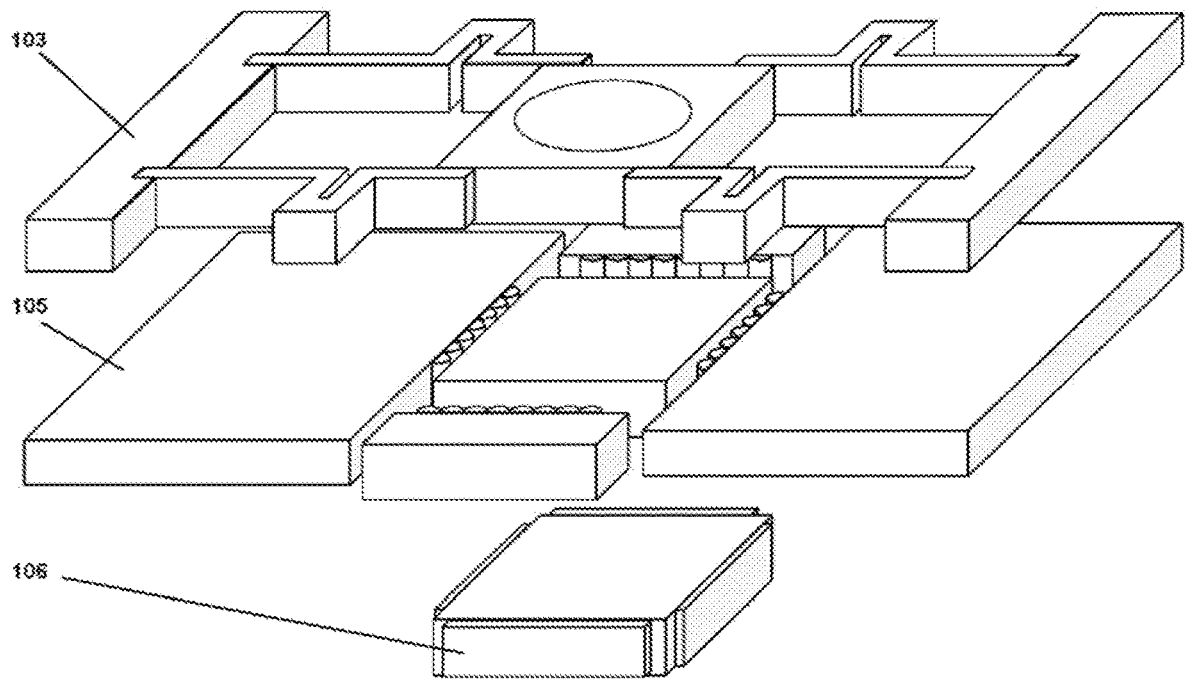
FIG. 2 is an exploded view illustrating a wafer stage according to one or more embodiments of the present invention.
Figure 3:
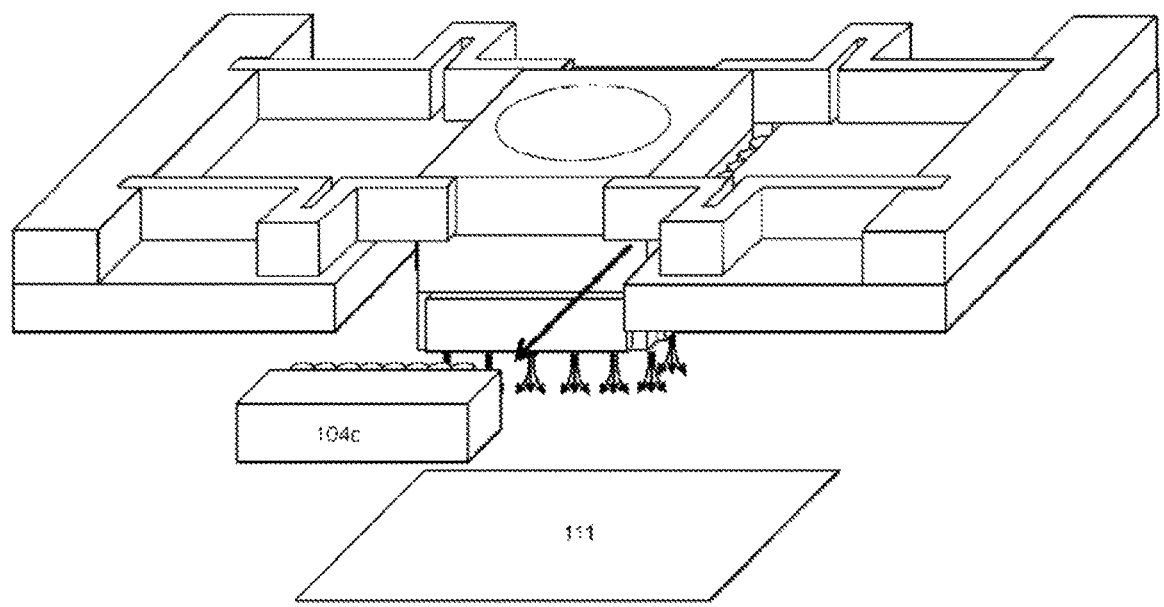
FIG. 3 is a schematic view illustrating a wafer stage according to one or more embodiments of the present invention.

FIG. 2 shows an exploded view illustrating the wafer stage according to one or more embodiments of the present invention. FIG. 3 shows a schematic view illustrating the wafer stage in an assembled state according to one or more embodiments of the present invention. The wafer mounting part 101 may include two (separable) portions, i.e. an upper portion and a lower portion. The upper portion of the wafer mounting part 101 is located in the upper layer 103, while the lower portion of the wafer mounting part 101 is located in the middle layer 105. As illustrated in FIG. 3, in the assembled wafer stage, the upper portion and the lower portion of the wafer mounting part 101 are fixedly joined with each other to form an integrated unit. In one or more embodiments, the wafer mounting part 101 can be a single component that is disposed through the upper layer 103 and the middle layer 105.

In FIG. 3, in order to show the internal structure of the wafer stage, the stepping buffering device 104c is shifted outwards. As illustrated in FIG. 3, the upper layer 103, the middle layer 105, and the lower layer 106 of the wafer stage are joined together sequentially. To minimize damping and/or friction encountered by the wafer mounting part 101 during the oscillatory movement, one or more of air cushion, magnetic levitation, etc. can be employed for levitating the wafer mounting part 101 (and the motorized member) in the air, so as to separate the wafer mounting part 101 (and the motorized member) from the platform 111 of the lithography system.

In one or more embodiments, the wafer mounting part 101 may be driven by electromagnetic motors, and the upper surface of the platform 111 may include a metal layer such that the wafer mounting part 101 is driven under the cooperative action of the metal layer and the electromagnetic motor coils (i.e. the electromagnetic motors 108) disposed on the motorized member.

Figure 4:
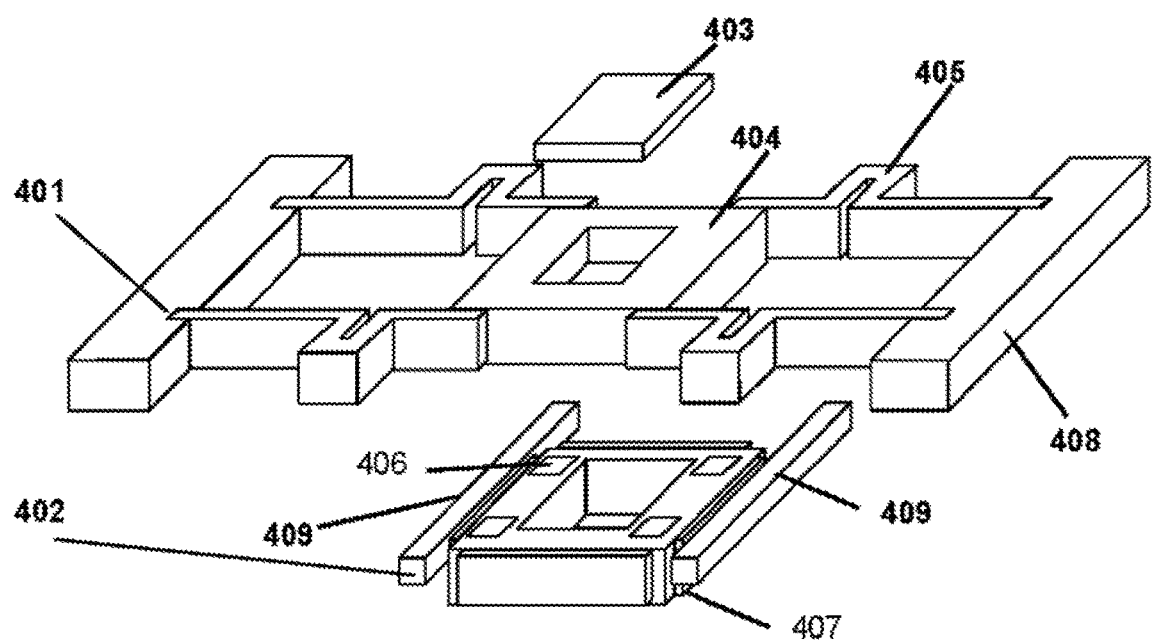
FIG. 4 is an exploded view illustrating a mask stage according to one or more embodiments of the present invention.

FIG. 4 shows an exploded view illustrating a mask stage according to one or more embodiments of the present invention. The mask stage comprises an upper layer 401 and a lower layer 402. In one or more embodiments, features of the upper layer 401 are analogous to features of the upper layer 103 of the wafer stage. In one or more embodiments, the upper layer 401 of the mask stage includes a mask mounting part 404 and elastic beams 405. The mask mounting part 404 is used for supporting a mask 403, and each of the elastic beams 405 elastically connects the mask mounting part 404 to the mask stage brackets 408 disposed at two sides of the mask stage. The mask stage brackets 408 are static during the exposure process, and under the action of the elastic beams 405, the mask mounting part 404 can go through an oscillatory movement alone and/or within a plane parallel to the surface of the mask 403.

Analogous to the elastic beams 102 described above with reference to FIG. 1A, the number and configuration of the elastic beams 405 and the shape of the mask mounting part 404 can be determined according to particular embodiments.

The lower layer 402 of the mask stage includes a motorized member (or a motorized portion of the mask mounting part 404), interferometer mirrors 407, electromagnetic motor coils 406, and electromagnetic motor stators 409. The electromagnetic motor coils 406 and the electromagnetic motor stators 409 together constitute the electromagnetic motors that drive the mask mounting part 404. The interferometer mirrors 407 are arranged around the motorized member in the lower layer 402. An interferometer of the mask stage is used for monitoring the current position of the mask mounting part 404 in cooperation with the interferometer mirrors 407. The interferometer is an example of a mask-position and/or mask-speed monitoring device. In one or more embodiments, one or more other position measuring devices, such as encoder-reader system, can be adopted for determining the position and/or speed of the mask 403. The electromagnetic motors are used for compensating for and/or sustaining the oscillatory movement of the mask mounting part 404. In one or more embodiments, since the mask stage needs to allow illuminating beams to penetrate therethrough from top to bottom, the electromagnetic motor coils 406 may be mounted at edge portions of the motorized member in the lower layer 402 of the mask stage. As illustrated in FIG. 4, motorized member (which may represent a portion of the mask mounting part 404) may have a hollow structure that can allow illuminating beams to pass through. Four electromagnetic motor coils 406 may be respectively arranged at four corners of the motorized member, and the two electromagnetic motor stators 409 are respectively arranged at two opposite sides of the motorized member such that the motorized member is disposed between the two electromagnetic motor stators 409. The two electromagnetic motor stators 409 the electromagnetic motor coils 406 together drive the mask mounting part 404.

The compensation process carried out for the mask mounting part 404 may be substantially analogous to the compensation process carried out for the wafer mounting part 101.

In one or more embodiments, in order to minimize damping and/or friction exerted on the mask mounting part 404, one or more of air cushion, magnetic levitation, etc. can be employed so as to levitate the mask mounting part 404 (and the motorized member) in the air.

Figure 5A:
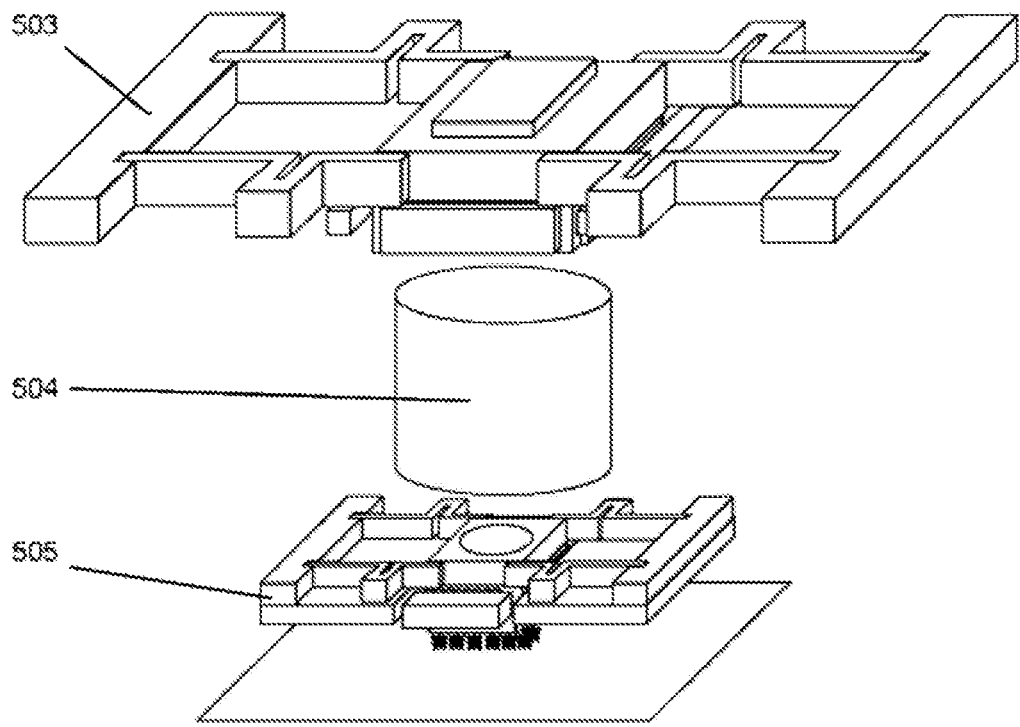
FIG. 5A is a schematic view illustrating a lithography system according to one or more embodiments of the present invention.
Figure 5B:
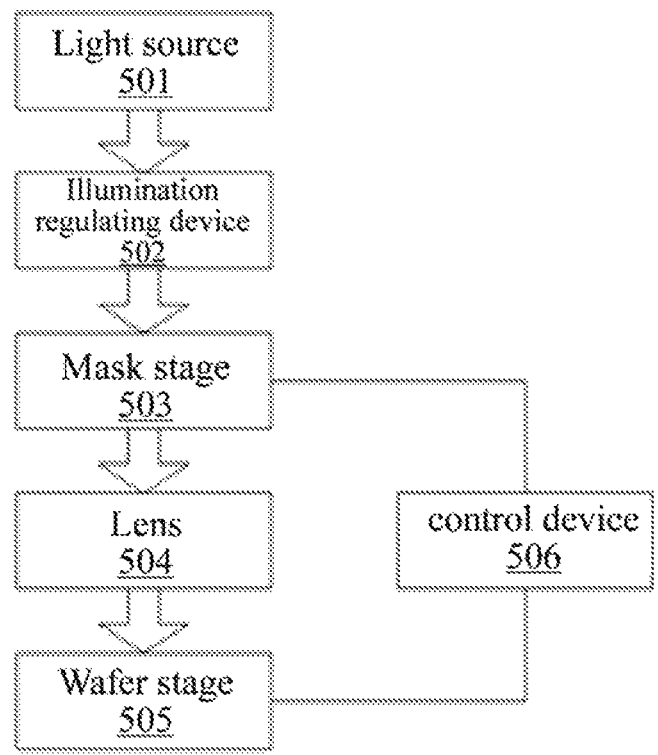
FIG. 5B is a block diagram illustrating a lithography system according to one or more embodiments of the present invention.

FIGS. 5A and 5B schematically illustrate a lithography system according to one or more embodiments of the present invention. FIG. 5A is a schematic view illustrating the lithography system, and FIG. 5B is a block diagram illustrating the lithography system. The lithography system comprises a light source 501 (not shown in FIG. 5A), an illumination regulating device 502 (not shown in FIG. 5A), a mask stage 503, a lens 504, a wafer stage 505, and a control device 506.

The light source 501 may be an ultraviolet light source, such as a mercury lamp or an excimer laser device. An excimer laser generally used for exposing a deep-UV photoresist is a KrF laser with a wavelength of 248 nm. The KrF laser typically has a power in a range from 10 W to 60 W and typically has a frequency of 1 kHz. The KrF laser can generate high-energy pulse radiation energy for exposing the photoresist. In one or more embodiments, one or more other excimer lasers (e.g. ArF laser) and/or one or more extremely ultraviolet light sources can also be used as the light source 501.

The illumination regulating device 502 regulates the illuminating beams emitted from the light source 501. The illumination regulating device 502 may allow a narrow and focused light strip to sweep over the mask and the wafer simultaneously. In one or more embodiments, the illumination regulating device 502 may regulate the intensity of an illuminating beam in accordance with the speeds of the wafer mounting part (101) and the mask mounting part (404). In the lithography system, both the mask and the wafer may have reciprocating and oscillatory movement, and their speeds may vary according to their positions. The movement and the speed variation may result in variation of speed of the light strip that sweeps over the wafer. To ensure that the photoresist on the wafer surface receives a uniform exposure dosage, the illumination regulating device 502 may regulate the intensity of the light strip, so as to facilitate uniform exposure on the wafer surface.

The light beam regulated by the illumination regulating device 502 may pass through the mask stage 503 and the lens 504 and may then irradiate onto the wafer stage 505. In one or more embodiments, the lithography system may be a step-and-scan photolithography machine, and the lens 504 may be a reducing lens with a reduction ratio of 4:1. In one or more embodiments, the lens 504 may have one or more of other reduction ratios, such as one or more of 5:1, 1:1, etc.

In one or more embodiments, the configuration of the mask stage 503 may be substantially identical to or analogous to the configuration of the mask stage described above with reference to FIG. 4; the configuration of the wafer stage 505 may be substantially identical to or analogous to the configuration of the wafer stage described above with reference to FIGS. 1 to 3.

The control device 506 is configured to synchronize the movement of the mask mounting part of the mask stage 503 with the movement of the wafer mounting part of the wafer stage 505. In one or more embodiments, the wafer mounting part and the mask mounting part may simultaneously and accurately move in opposite directions for step scanning. In one or more embodiments, the (reduction) lens 504 has a reduction ratio of 4:1, the oscillation frequency of the wafer mounting part is substantially equal to the oscillation frequency of the mask mounting part, and the oscillation amplitude of the mask mounting part is substantially four times the oscillation amplitude of the wafer mounting part.

In one or more embodiments, the control device 506 may enable position compensation. The control device 506 may receive a current position of the mask mounting part obtained from the monitoring device (e.g. an interferometer) of the mask stage 503 and may compare the current position of the mask mounting part with an ideal or expected position of the mask mounting part (i.e. a position of the mask mounting part if it undergoes a substantially resistance-free oscillatory movement without any substantial damping or friction), so as to calculate a compensation amount for the mask mounting part. Subsequently, the control device 506 may instruct the electromagnetic motors of the mask stage 503 to compensate for the oscillatory movement of the mask mounting part.

In one or more embodiments, the control device 506 may receive a current position of the wafer mounting part obtained from the monitoring device (e.g. an interferometer) of the wafer stage 505 and may compare the current position of the wafer mounting part with an ideal or expected position of the wafer mounting part (i.e. a position of the wafer mounting part if it undergoes a substantially resistance-free oscillatory movement without any substantial damping or friction), so as to calculate a compensation amount for the wafer mounting part. Subsequently, the control device 506 may instruct the electromagnetic motors of the wafer stage 505 to compensate for the oscillatory movement of the wafer mounting part.

Below, the lithography method according to one or more embodiments of the present invention will be described.

The lithography process can be roughly divided into eight steps:
1. Forming a base film by vapour phase deposition;
2. Spin coating a photoresist;
3. Soft baking;
4. Alignment and exposure;
5. Post exposure baking (PEB);
6. Development;
7. Hard baking;
8. Development examination.

Embodiments of the present invention may substantially improve the exposure process at the fourth step. FIG. 6 shows a flowchart illustrating a lithography method according to one or more embodiments of the present invention. In this flowchart, specific steps of the exposure process are illustrated, and one of ordinary skill in the art can perform processing of other steps in conjunction with knowledge of the prior arts.

As illustrated in FIG. 6, in the lithography method, when carrying out the exposure process, in step 601, the control device 506 of the lithography system causes each of the mask and the wafer (a surface of which is coated with a photoresist) to perform an oscillatory movement along and/or within a respective plane, and the oscillatory movement of the mask and the oscillatory movement of the wafer are synchronized with each other. In one or more embodiments, the oscillatory movement of the mask is along and/or within a plane parallel to a mask surface (through which an illuminating light beam is provided), while the oscillatory movement of the wafer is along and/or within a plane parallel to the wafer surface on which the photoresist is coated. In one or more embodiments, the mask and the wafer are parallel to each other, and the two associated planes of oscillatory movements are parallel to each other. In one or more embodiments, step scanning is performed for exposure, and the mask and the wafer move simultaneously in opposite directions.

In step 602, the intensity of the illuminating beam is regulated by the illumination regulating device 502. Due to the oscillatory movements of the mask and the wafer, their speeds both vary continuously with time. The photoresist coated over the wafer surface may preferably need to receive the same exposure dosage during the exposure process. If the intensity of the illuminating beam does not change, a photoresist portion on an area where the speeds of the movement of the wafer and the mask are relatively fast will receive less exposure dosage, while a photoresist portion on an area where the speeds of the movement of the wafer and the mask are relatively slow will receive more exposure dosage; accordingly, variation of exposure dosage occurs, and a result of the exposure process may be undesirable. In one or more embodiments, the illumination regulating device 502 may regulate the illuminating beam emitted from the light source 501 such that photoresist portions on different areas of the wafer surface will receive substantially the same exposure dosage.

In one or more embodiments, the illumination regulating device 502 may regulate the intensity of the illuminating beam in accordance with the ideal or expected speeds of the movements of the wafer mounting part and the mask mounting part. For a given wafer stage and a given mask stage, their oscillation frequencies and oscillation amplitudes have already been set during the design and manufacture process. Thus, the speed of each of the wafer and the mask corresponding to each position (or each timing point) during the movement is known (given that damping may be compensated for). The illumination regulating device can regulate the intensity of the illuminating beam in accordance with the theoretical moving speeds (expected speeds, where damping is neglected) of the wafer and the mask, such that photoresist portions on different areas of the wafer surface can receive uniform exposure dosage.

In one or more embodiments, the illumination regulating device 502 may regulate the intensity of the illuminating beam in accordance with the actual moving speeds of the wafer and the mask. During the actual exposure process, the wafer mounting part and the mask mounting part may inevitably be affected by damping, which may make the actual moving speeds of the wafer and the mask deviate from the ideal or expected speeds. In one or more embodiments, the illumination regulating device 502 can also receive monitoring signals from the monitoring devices of the wafer stage and the mask stage, thereby acquiring the actual speeds of the wafer and the mask. Subsequently, the illumination regulating device 502 can regulate the intensity of the illuminating beam in accordance with the actual speeds of the wafer and the mask, so as to ensure that photoresist portions on different areas of the wafer surface receive the same exposure dosage.

In step 603, the illuminating beam regulated by the illumination regulating device 502 irradiates through the mask and irradiates on at least a portion of the wafer, thereby performing exposure of the photoresist. After subsequent processes, a desirable photoresist pattern may be obtained.

In contrast with constant-speed movement arrangements of wafers and masks in conventional lithography systems and methods, oscillatory movements (e.g. simple harmonic oscillations) of the wafer and the mask are implemented in accordance with embodiments of the invention. In the oscillatory movement, the wafer and the mask may accelerate and decelerate during the scanning. Even if the speeds of the wafer and the mask are very fast, the respective driving device only needs to compensate for the energy lost due to damping. The power consumption of the driving device may not substantially increase as the speeds of the wafer and the mask increase. Accordingly, the driving devices of the wafer stage and the mask stage can work at a lower power. Advantageously, heat generated by the driving devices and power consumed by the driving devices may be minimized, and requirements for heat dissipation devices and associated costs may be minimized.

In one or more embodiments, the oscillatory movement may maximize the speed of the exposure process, thereby maximizing the manufacturing yield.

In contrast with the very high acceleration required before and after the constant-speed scanning in conventional lithography systems and methods, which may produce pressure wave in the wafer and the mask, the acceleration required in the oscillatory movement according to embodiments of the present invention is much smaller. Advantageously, embodiments of the invention may minimize or even eliminate pressure wave in the wafer and/or the mask.

So far, lithography systems and lithography methods according to embodiments of the present invention have been described in detail. In order to not obscure the description, some details known in the related art are not described. One of ordinary skill in the art should know how to implement the technical solution disclosed herein based on the above description.

Although some specific embodiments of the present invention have been described in detail by way of examples, one of ordinary skill in the art should understand that these examples are illustrative but not limiting. One of ordinary skill in the art should understand that the above embodiments can be modified without departing from the scope defined by the attached claims.

What is claimed is:

1. A lithography system comprising:
    a mask mounting part configured to carry a mask and configured to oscillate along a plane that is parallel to a top surface of the mask in a wafer exposure process; and
    a first driving device having a first body, having a first through hole, and configured to affect an oscillatory movement of the mask mounting part in the wafer exposure process, wherein the first driving device comprises an electromagnetic motor stator and an electromagnetic motor coil, wherein a face of the first body is positioned between the electromagnetic motor stator and the electromagnetic motor coil, wherein the electromagnetic motor coil is completely positioned between the face of the first body and the first through hole, wherein the first through hole extends through the first body in a direction perpendicular to the plane, and wherein a position of the first through hole is configured to overlap the mask in the wafer exposure process.

2. The lithography system of claim 1 further comprising:
    a light source configured to emit an illuminating beam in the wafer exposure process;
    a wafer mounting part configured to carry a wafer and configured to oscillate along a plane that is parallel to a top surface of the wafer in the wafer exposure process; and
    a second driving device configured to affect an oscillatory movement of the wafer mounting part in the wafer exposure process.

3. The lithography system of claim 2, wherein the mask mounting part is configured to move in a first direction when the wafer mounting part moves in a second direction opposite the first direction in the wafer exposure process.

4. The lithography system of claim 2,
    wherein an oscillation frequency of the mask mounting part is equal to an oscillation frequency of the wafer mounting part in the wafer exposure process, and
    wherein an oscillation amplitude of the mask mounting part is greater than an oscillation amplitude of the wafer mounting part and is a multiple of the oscillation amplitude of the wafer mounting part in the wafer exposure process.

5. The lithography system of claim 1 further comprising: a lens, wherein the first driving device is positioned between the mask and the lens, and wherein the lens overlaps the position of the first through hole.

6. The lithography system of claim 1, wherein the mask mounting part has a second through hole, and wherein a position of the second through hole overlaps the position of the first through hole.

7. The lithography system of claim 1, wherein the first driving device comprises two electromagnetic motor coils that are positioned on the first body and are positioned at opposite sides of the first through hole.

8. The lithography system of claim 1, wherein the first driving device comprises a monitoring device overlapping the face of the first body and positioned between the electromagnetic motor stator and the face of the first body.

9. A lithography method comprising:
    oscillating, using a driving device that has a first body and has a first through hole, a mask along a plane that is parallel to a top surface of the mask when the mask overlaps a position of the first through hole, wherein the first through hole extends through the first body in a direction perpendicular to the top surface of the mask, wherein the mask is supported by a mask mounting part, wherein the mask mounting part is connected to an elastic beam, wherein the driving device comprises an electromagnetic motor stator, and wherein the electromagnetic motor stator neighbors the first body and intersects the elastic beam; and
    oscillating a wafer along a plane that is parallel to a top surface of the wafer.

10. The lithography method of claim 9,
    wherein an oscillation frequency of the mask is equal to an oscillation frequency of the wafer, and
    wherein an oscillation amplitude of the mask is greater than an oscillation amplitude of the wafer and is a multiple of the oscillation amplitude of the wafer.

11. The lithography method of claim 9 further comprising: positioning the driving device between the mask and a lens, wherein the lens overlaps the position of the first through hole.

12. The lithography method of claim 9 further comprising: using a mask mounting part to carry the mask, wherein the mask mounting part has a second through hole, and wherein a position of the second through hole overlaps the position of the first through hole.

13. The lithography method of claim 9, wherein the driving device comprises two electromagnetic motor coils that are positioned on the first body and are positioned at opposite sides of the first through hole.

14. A lithography system comprising:
    a mask mounting part configured to carry a mask and configured to oscillate along a plane that is parallel to a top surface of the mask in a wafer exposure process;

a first driving device comprising a first body, a first through hole, an electromagnetic motor stator, and an electromagnetic motor coil, wherein the first driving device is configured to affect an oscillatory movement of the mask mounting part in the wafer exposure process, wherein the electromagnetic motor coil is positioned between the electromagnetic motor stator and the first through hole, wherein the first through hole extends through the first body in a direction perpendicular to the plane, and wherein a position of the first through hole is configured to overlap the mask in the wafer exposure process; and an elastic beam connected to the mask mounting part and intersecting the electromagnetic motor stator.

15. The lithography system of claim 14, wherein the elastic beam has a bent or curved portion, and wherein the electromagnetic motor stator is positioned between the first body and the bent or curved portion.

\* \* \* \* \*